US006995566B2

(12) United States Patent
Yamaoka et al.

(10) Patent No.: US 6,995,566 B2
(45) Date of Patent: Feb. 7, 2006

(54) CIRCUIT PATTERN INSPECTION APPARATUS, CIRCUIT PATTERN INSPECTION METHOD, AND RECORDING MEDIUM (75) Inventors: Shuji Yamaoka, Hiroshima (JP); Shogo Ishioka, Hiroshima (JP)

(73) Assignee: OHT, Inc., Hiroshima (JP)

(*) Notice: Subject to any disclaimer, the term of this patent is extended or adjusted under 35 U.S.C. 154(b) by 124 days.

(21) Appl. No.: 10/478,351

(22) PCT Filed: May 23, 2002

(86) PCT No.: PCT/JP02/04991

§ 371 (c)(1),
(2), (4) Date: Nov. 21, 2003

(87) PCT Pub. No.: WO02/101398

PCT Pub. Date: Dec. 19, 2002

(65) Prior Publication Data
US 2004/0150409 A1 Aug. 5, 2004

(30) Foreign Application Priority Data
May 24, 2001 (JP) ............................. 2001-155533

(51) Int. Cl.
G01R 31/28 (2006.01)
(52) U.S. Cl. .................. 324/519; 324/537; 324/690
(58) Field of Classification Search ................ 257/700; 324/519, 537, 760, 765, 770; 430/5; 438/705
See application file for complete search history.

(56) References Cited

U.S. PATENT DOCUMENTS 6,110,643 A * 8/2000 Rath et al. ............... 430/280.1
6,201,398 B1 * 3/2001 Takada ....................... 324/537
6,316,949 B1 * 11/2001 Yamashita .................. 324/683
6,771,077 B2 * 8/2004 Hamamura et al. ......... 324/537

FOREIGN PATENT DOCUMENTS

| JP | 05-333357 | 12/1993 |
| JP | 06-70664 | 9/1994 |
| JP | 7-146323 | 6/1995 |
| JP | 2000-155149 | 6/2000 |
| JP | 2001-41994 | 2/2001 |
| JP | 2001-296326 | 10/2001 |

* cited by examiner

Primary Examiner—Walter Benson
(74) Attorney, Agent, or Firm—Westerman, Hattori, Daniels & Adrian, LLP (57) ABSTRACT Disclosed is a circuit-pattern inspection apparatus for inspecting a comb-shaped pattern 20 having an edge region formed as a plurality of finger pattern segments and a base region formed as an integral connection pattern segment, and a plurality of discrete patterns 30 each disposed between the adjacent finger pattern segments in a non-connecting manner and being not in connecting with the remaining discrete patterns. The inspection apparatus comprises means for supplying an AC signal alternately to either one of the finger pattern segments and both the finger pattern segments and the discrete patterns while maintaining the other at a ground potential, and sensors 131, 132, 133 for detecting the AC signal disposed in the edge region. The inspection apparatus can reliably detect the presence of defects in a circuit board without any difficulties.

10 Claims, 5 Drawing Sheets

CIRCUIT PATTERN INSPECTION APPARATUS, CIRCUIT PATTERN INSPECTION METHOD, AND RECORDING MEDIUM

TECHNICAL FIELD

The present invention relates to an apparatus and method for inspecting conductive patterns formed on a circuit board made, for example, of glass. The present invention also relates to a recording medium recording therein a computer program for implementing such an inspection.

BACKGROUND ART

There has been known a pin-contact type inspection system for inspecting the presence of defects in circuit patterns or conductive patterns formed on a board. The pin-contact type inspection system is constructed to inspect the electrical conduction between both ends of a conductive pattern as an inspection object, in accordance with a resistance value of the conductive pattern obtained by bringing a pair of pin probes into direct contact with the ends of the conductive pattern, respectively, and detecting a voltage which is generated at one of the pin probes in response to a certain current supplied to the other pin probe.

The pin-contact type inspection system is advantageous to have a high S/N ratio because the pin probes are brought into direct contact with the conductive pattern. On the other hand, in inspecting a board having conductive patterns arranged at a fine pitch, the pin-contact type inspection system will be suffered from difficulties in bringing the pin probes into contact with an intended conductive pattern, and in adequately positioning the pin probes even if they can be successfully brought into contact with the intended conductive pattern.

In view of this problem, a non-contact/contact combination type inspection system has been proposed in which an inspection signal including an AC component is applied to a pin probe in direct contact with one end of a conductive pattern as an inspection object, and the inspection signal is detected from a probe positioned such that it is spaced apart from the other end of the conductive pattern in a non-contact manner, through the capacitive coupling between the non-contact probe and the conductive pattern.

Since the non-contact/contact combination type inspection system allows the need for being in direct contact with the conductive pattern as in the pin probe to be eliminated from the non-contact probe at the other end of the conductive pattern, the positioning accuracy of the non-contact probe can be roughly set up. In addition, the non-contact probe can be designed such that it is commonly used for a plurality of conductive patterns to reduce the number of probes. Therefore, the non-contact/contact combination type inspection system can handle a board having conductive patterns arranged at a fine pitch.

There has also been known a slide type inspection apparatus comprising a pair of probes adapted to be slidably moved in a synchronous manner while being sequentially located at both ends of each of conductive patterns, respectively. This slide type inspection apparatus can advantageously eliminate the need for preparing a dedicated jig for each of different boards.

In the aforementioned pin-contact type and non-contact/contact combination type inspection systems, the arrangement of the probes at both ends of each of conductive patterns and/or the processing of detected signal from one of the probes is varied depending on the distance or pitch between the adjacent conductive patterns. Thus, these systems can inspect only one kind of board having a predetermined configuration of conductive patterns, and a jig to be used therein has to be prepared in conformity with each of different configurations of conductive patterns.

The slide type inspection apparatus is workable on the condition that the pitch between adjacent conductive patterns in one ends thereof is approximately equal to that in the other ends. If there is a difference between the respective pattern pitches in one ends and the other ends of the conductive patterns, any inspection becomes impossible because the probes cannot be located at both ends of each of the conductive patterns, respectively, in a synchronous manner or at the same time.

In view of the above problems, it is therefore an object of the present invention to provide a circuit-pattern inspection apparatus capable of readily inspecting the presence of defects in conductive patterns, for example, even if a probe is positioned to both ends of the conductive patterns in a non-contact manner, and there is a difference between the respective pattern pitches in one ends and the other ends of the conductive patterns.

DISCLOSURE OF INVENTION

In order to achieve the above object, according to a first aspect of the present invention, there is provided a circuit-pattern inspection apparatus for inspecting conductive patterns formed on a board, wherein the conductive patterns include: a conductive comb-shaped pattern which has an edge region formed as a plurality of finger pattern segments arranged approximately in parallel with each other and a base region formed as an integral connection pattern segment integrally connecting the base-side ends of the finger pattern segments; and a plurality of conductive discrete patterns each disposed between the adjacent finger pattern segments to extend from the vicinity of the base region to the vicinity of the edge region of the comb-shaped pattern in a non-connecting manner, and each of at least a part of the discrete patterns is not in connecting with the remaining discrete patterns. The circuit-pattern inspection apparatus comprises: edge-region capacitive coupling means adapted to be capacitively coupled with the finger pattern segments and the discrete patterns one by one in the vicinity of the edge region of the comb-shaped pattern while ensuring a sufficient coupling capacity therebetween in a non-contact manner; base-region capacitive coupling means extending in a given range capable of being capacitively coupled with the entire region of the connection pattern segment of the comb-shaped pattern while ensuring a sufficient coupling capacity therebetween in a non-contact manner; common capacitive coupling means extending in a given range capable of being capacitively coupled with the respective base-side ends of the finger pattern segments branched from the connection pattern segment and the respective base-side ends of the discrete patterns located adjacent to the base region of the comb-shaped pattern, while ensuring a sufficient coupling capacity therebetween in a non-contact manner; inspection-signal supply means for supplying an inspection signal to either one of the base-region capacitive coupling means and the common capacitive coupling means; and detect means for detecting changes in a signal from the respective edge-side ends of the finger pattern segments and the discrete patterns through the edge-region capacitive coupling means in response to the inspection signal supplied from the inspection-signal supply means. Each of the comb-shaped pattern and the discrete patterns is inspected in accordance with a first detection result obtained through the detect means in response to the inspection signal supplied to the base-region capacitive coupling means, and a second detection result obtained by the detect means in response to the inspection signal supplied to the common capacitive coupling means.

In the circuit-pattern inspection apparatus as set forth in the first aspect of the present invention, the board may be principally made of glass. In this case, each of the finger pattern segments and the discrete patterns may be formed in a strip shape having a given width, and the finger pattern segments and the discrete patterns are alternately arranged on the glass board in the width direction.

Each of the edge-region, base-region and common capacitive coupling means may include a non-contact plate adapted to be controllably positioned to the conductive patterns while leaving a given distance therebetween.

The non-contact plate of the edge-region capacitive coupling means may extends in a range equal to or less than the width of each of the finger pattern segments and the discrete patterns to be capacitively coupled with the non-contact plate of the edge-region capacitive coupling means.

The non-contact plates of the base-region capacitive coupling means may have approximately the same area to be opposed to and capacitively coupled with the conductive patterns, as that of the non-contact plates of the common coupling means.

In the circuit-pattern inspection apparatus as set forth in the first aspect of the present invention, the inspection signal may be an AC signal.

According to a second aspect of the present invention, there is provided a circuit-pattern inspection apparatus for inspecting an integral pattern which has an edge region formed as a plurality of finger pattern segments arranged approximately in parallel with each other and a base region formed as an integral connection pattern segment integrally connecting the base-side ends of the finger pattern segments, and a plurality of discrete patterns alternately arranged with the finger pattern segments in a non-connecting manner, wherein each of the discrete patterns is not in connecting with the remaining discrete patterns. The circuit-pattern inspection apparatus comprises: AC signal supply control means for supplying an AC signal to a first zone consisting of either one of the integral connection pattern segment and all of the base-side ends of the finger pattern segments and the discrete patterns while maintaining a second zone consisting of the other of the integral connection pattern segment and all of the edge-side ends of the finger pattern segments and the discrete patterns, at a common potential, and for, after the supplied AC signal is detected from the respective edge-side ends of the finger pattern segments and the discrete patterns, supplying an AC signal to the second zone while maintaining the first zone at a common potential; and detect means for detecting the supplied AC signal through the respective edge-side ends of the finger pattern segments and the discrete patterns.

According to a third aspect of the present invention, there is provided a method for inspecting conductive patterns formed on a board, wherein the conductive patterns include: a conductive comb-shaped pattern which has an edge region formed as a plurality of finger pattern segments arranged approximately in parallel with each other and a base region formed as an integral connection pattern segment integrally connecting the base-side ends of the finger pattern segments; and a plurality of conductive discrete patterns each disposed between the adjacent finger pattern segments to extend from the vicinity of the base region to the vicinity of the edge region of the comb-shaped pattern in a non-connecting manner, and each of at least a part of the discrete patterns is not in connecting with the remaining discrete patterns. The method comprises the steps of: supplying an AC signal to a first zone consisting of either one of base-region and common capacitive coupling means so as to provide the AC signal to a portion of the conductive patterns to be inspected while maintaining a second zone consisting of the other of the base-region and common capacitive coupling means, at a ground potential, wherein the base-region capacitive coupling means extends in a given range capable of being capacitively coupled with the entire region of the connection pattern segment of the comb-shaped pattern while ensuring a sufficient coupling capacity therebetween in a non-contact manner, and the common capacitive coupling means extends in a given range capable of being capacitively coupled with the respective base-side ends of the finger pattern segments branched from the connection pattern segment and the respective base-side ends of the discrete patterns located adjacent to the base region of the comb-shaped pattern, while ensuring a sufficient coupling capacity therebetween in a non-contact manner; detecting the provided AC signal through edge-region capacitive coupling means adapted to be capacitively coupled with the finger pattern segments and the discrete patterns on by one in the vicinity of the edge region of the comb-shaped pattern while ensuring a sufficient coupling capacity therebetween in a non-contact manner; after the AC signal is detected from all of the finger pattern segments and the discrete patterns, supplying an AC signal to the second zone so as to provide the AC signal to a portion of the conductive patterns to be inspected while maintaining the first zone at a ground potential; detecting the provided AC signal through the edge-region capacitive coupling means; and determining the presence of defects in the inspected conductive patterns in accordance with a first detection result obtained in response to the AC signal supplied to the first zone, and a second detection result obtained in response to the AC signal supplied to the second zone.

According to a fourth aspect of the present invention, there is provided a method for inspecting an integral pattern which has an edge region formed as a plurality of finger pattern segments arranged approximately in parallel with each other and a base region formed as an integral connection pattern segment integrally connecting the base-side ends of the finger pattern segments, and a plurality of discrete patterns alternately arranged with the finger pattern segments in a non-connecting manner, wherein each of the discrete patterns is not in connecting with the remaining discrete patterns. The method comprises the steps of: supplying an AC signal to a first zone consisting of either one of the connection pattern segment and all of the base-side ends of the finger pattern segments and the discrete patterns while maintaining a second zone consisting of the other of the connection pattern segment and all of the edge-side ends of the finger pattern segments and the discrete patterns, at a common potential; detecting the supplied AC signal from the respective edge-side ends of the finger pattern segments and the discrete patterns; supplying an AC signal to the second zone while maintaining the first zone at a common potential; and detecting the supplied AC signal from the respective edge-side ends of the finger pattern segments and the discrete patterns.

BEST MODE FOR CARRYING OUT THE INVENTION

With reference to the drawings, one embodiment of the present invention will now be described in detail. While the following description will be made by taking dot-matrix patterns of a dot matrix display panel before assembled in a liquid-crystal display panel, as one example of conductive patterns to be inspected by a circuit-pattern inspection apparatus according to one embodiment of the present invention, the inspection object of the present invention is not limited to the following dot-matrix patterns, but the present invention may be applied to any other conductive patterns which have opposed end regions different in pattern configuration, and allow a capacitive coupling type sensor to be positioned across and capacitively coupled with the respective conductive patterns in each of the end regions.

Figure 1:
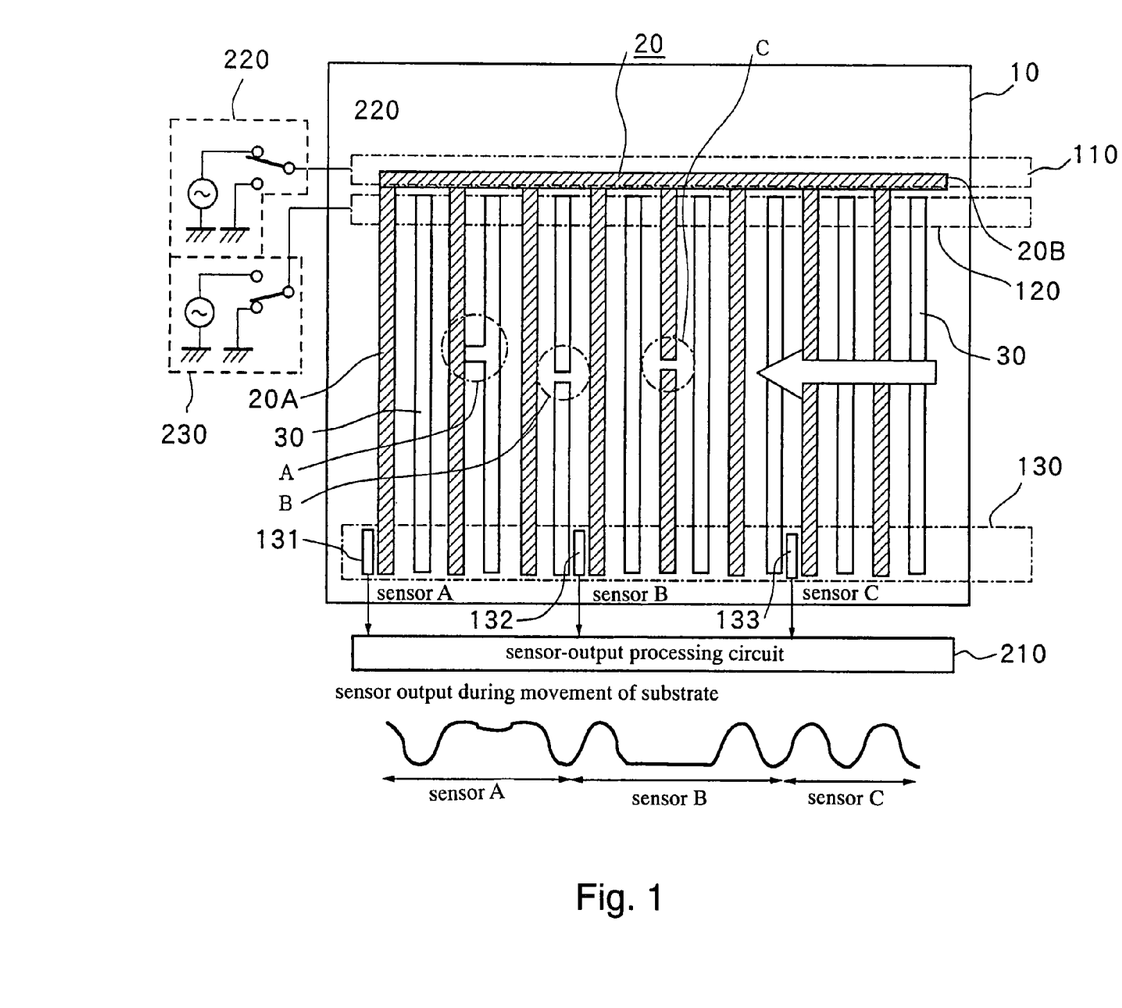
FIG. 1 is an explanatory schematic diagram of a circuit-pattern inspection apparatus according to one embodiment of the present invention.

FIG. 1 is an explanatory schematic diagram of a circuit-pattern inspection apparatus according to one embodiment of the present invention.

In FIG. 1, the reference numeral 10 indicates a board formed with conductive patterns to be inspected by the circuit-pattern inspection apparatus. In this embodiment, the board is a glass board for use in a liquid-crystal display panel.

The conductive patterns to be inspected by the circuit-pattern inspection apparatus are arranged on the surface of the glass board 10 for forming a dot-matrix display panel.

The conductive patterns include a comb-shaped pattern 20 which has a plurality of finger pattern segments 20A arranged approximately in parallel with each other, and a base region formed as an integral connection pattern segment 20B integrally connecting the respective base-side ends of the finger pattern segments 20A. The conductive patterns also include a plurality of strip-shaped discrete patterns 30 each disposed between the adjacent finger pattern segments 20A of the comb-shaped pattern 20 indicated by diagonal lines, in non-connecting manner. Each of the strip-shaped patterns 30 is not in connecting with, or independent of, the remaining strip-shaped patterns.

In the embodiment illustrated in FIG. 1, except for the connection pattern segment 20B in the base region of the comb-shaped pattern 20, each of the finger pattern segments 20A has a width approximately equal to that of each of the discrete patterns 30. Further, the finger pattern segments 20A and the discrete patterns 30 are arranged at approximately even intervals or pitches.

The reference numeral 110 indicates a base-region feed panel for allowing an AC signal supplied from an AC source 220 to be provided to the comb-shaped pattern 20. During inspection, the base-region feed panel 110 serving as base-region capacitive coupling means is positioned in opposed relation to the base region or the connection pattern segment 20B of the comb-shaped pattern 20, in a non-contact manner. The base-region feed panel 110 extends in a range capable of covering the entire region of the connection pattern segment 20B. When the base-region feed panel 110 is positioned, it can be capacitively coupled with the entire region of the connection pattern segment 20B while ensuring a sufficient coupling capacity therebetween.

The reference numeral 120 indicates a common feed panel for allowing an AC signal supplied from an AC source 230 to be provided to the comb-shaped pattern 20 and the discrete patterns 30. During inspection, the common feed panel 120 serving as common capacitive coupling means is positioned adjacent to the base-region feed panel 110 and in opposed relation to the respective ends of the finger pattern segments 20A on the side of the connection pattern segment 20B and the respective ends of the discrete patterns 20 on the side of the base region of the comb-shaped pattern 20, in a non-contact manner. The common feed panel 120 has approximately the same size as that of the base-region feed panel 110. When the common feed panel 120 is positioned, it can be capacitively coupled with the finger pattern segments 20A and the discrete patterns 20 while ensuring a sufficient coupling capacity therebetween.

In this embodiment, the base-region feed panel 110 has approximately the same area as that of the common feed panel 120. Thus, the respective areas of the panels 110, 120 to be opposed to the conductive patterns as an inspection object will be approximately equalized so as to suppress the variance in the level of a detected signal due to switching between the feed panels.

The reference numeral 130 indicates a sensor plate adapted to be positioned adjacent to the respective edge of the discrete patterns 30 and the finger pattern segments 20A of the comb-shaped pattern 20, in a non-contact manner during inspection. The sensor plate 130 includes three sensors 131, 132, 133 disposed at even intervals.

The interval or distance between the adjacent sensors 131, 132, 133 is set at a value multiple-times greater than at least the pitch or distance between the finger pattern segment 20A and the discrete pattern 30 adjacent thereto. When the sensor plate 130 is positioned, the sensors 131, 132, 133 serving as edge-region capacitive coupling means are capacitively coupled with the finger pattern segments 20A and the discrete patterns 30 one by one while ensuring a sufficient coupling capacity therebetween.

Each of the sensors 131, 132, 133 is operable to detect the AC signal which is supplied from either one of the base-region feed panel 110 and the common feed panel 120 and transmitted through the conductive patterns.

In this embodiment, an AC signal is supplied to either one of the base-region feed panel 110 and the common feed panel 120 while maintaining the other of the base-region and common feed panels 110, 120 at a ground potential, and the board 10 is moved in the direction of the arrow in FIG. 1, for example, at a constant speed. Thus, the AC signal supplied from either one of the base-region feed panel 110 and the common feed panel 120 and transmitted through the comb-shaped pattern 20 or the discrete patterns 30 is sequentially detected by the sensors 131, 132, 133.

The reference numeral 210 indicates a sensor-output processing circuit for amplifying and shaping a detected signal from each of the sensors 131, 132, 133 in the form of changes in field intensity, converting the detected signal into an analog signal and optionally converting the analog signal to a digital signal according to need, and outputting the analog or digital signal.

The reference numerals 220 and 230 indicate a first AC signal generating unit for generating an AC signal with a given frequency and supplying the AC signal to the comb-shaped pattern 20 through the base-region feed panel 110, and a second AC signal generating unit for generating an AC signal with a given frequency and supplying the AC signal to both of the comb-shaped pattern 20 and the discrete patterns 30 through the common feed panel 120.

While the embodiment in FIG. 1 employs the separated AC signal generating units 220, 230, it is understood that the AC signal generating units may be constructed as a single unit, because the AC signal is switchably supplied to either one of the base-region feed panel 110 and the common feed panel 120 but not simultaneously supplied to both of them, as described later. Specifically, the single AC signal generating unit may be constructed such that it controllably supplies an AC signal to either one of the base-region feed panel 110 and the common feed panel 120 while maintaining the other of the base-region feed panel 110 and the common feed panel 120 at a common potential (e.g. ground potential).

In this embodiment, all of the base-region feed panel 110, the common feed panel 120 and the sensor plate 130 are attached and positioned onto a single sensor panel in such a manner that the respective surfaces of the base-region feed panel 110, the common feed panel 120, and the sensors 131, 132, 133 provided in the sensor plate 130 are flush with each other.

Figure 2:
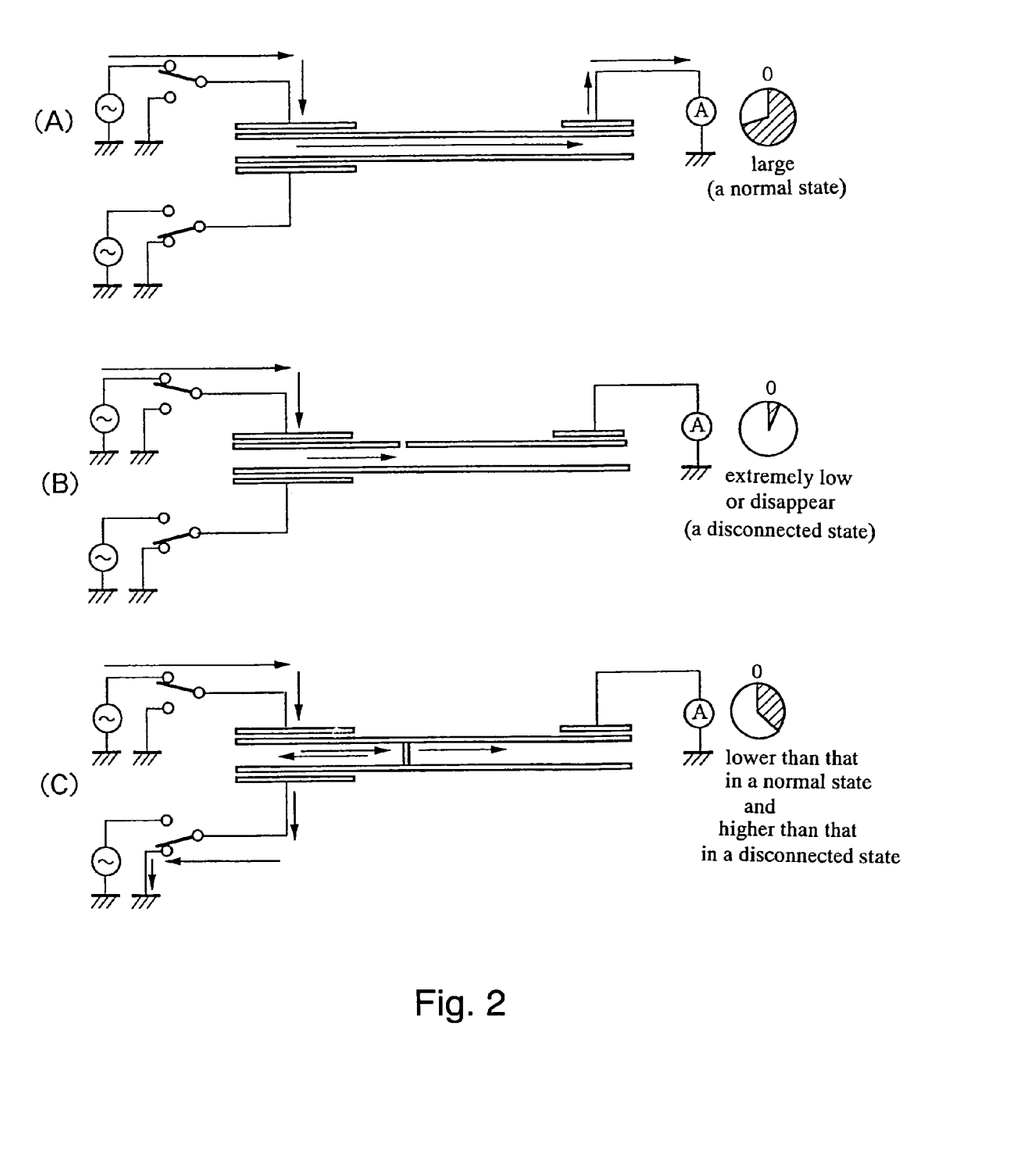
FIGS. 2(A) to 2(C) are explanatory diagrams of the inspection principle of the circuit-pattern inspection apparatus.

With reference to FIGS. 2(A) to 2(C), the principle of inspecting conductive patterns using the above circuit-pattern inspection apparatus will be described below. FIG. 2(A) shows an inspection operation of conductive patterns in a normal state, FIG. 2(B) showing an inspection operation of a conductive pattern including a disconnected portion, and FIG. 2(C) showing an inspection operation of adjacent conductive patterns including a contact portion therebetween.

The disconnected portion of the conductive pattern in FIG. 2(B) corresponds to the region B or C in FIG. 1, and the connecting portion between the adjacent patterns in FIG. 2(C) corresponds to the region A in FIG. 1.

As shown in FIG. 2(A), when conductive patterns are in a normal state, an AC signal (AC power) supplied from one of the AC signal generating units to one of the conductive patterns through one of the feed panels is transmitted through the conductive pattern and detected by the sensor. Then, the sensor-output processing circuit 210 outputs a detection result having a given detection level as shown on the right side of FIG. 2(A).

As shown in FIG. 2(B), when a conductive pattern partly includes a disconnected portion, an AC signal (AC power) supplied from one of the AC signal generating units to the conductive pattern through one of the feed panels is not transmitted to the sensor due to the disconnected portion in the conductive pattern. Thus, a detected signal from the sensor will become extremely low or disappear, as shown on the right side of FIG. 2(B).

As shown in FIG. 2(C), when first and second conductive patterns adjacent to one another include a connecting (short-circuited) portion therebetween, an AC signal (AC power) supplied from one of the AC signal generating units to the first conductive pattern through one of the feed panels is transmitted not only to the sensor through the first conductive pattern, but also to the second conductive pattern through the contact portion. Thus, a detected signal from the sensor will have a level which is lower than that in a normal state and higher than that in a disconnected state, as shown on the right side of FIG. 2(C).

Figure 3:
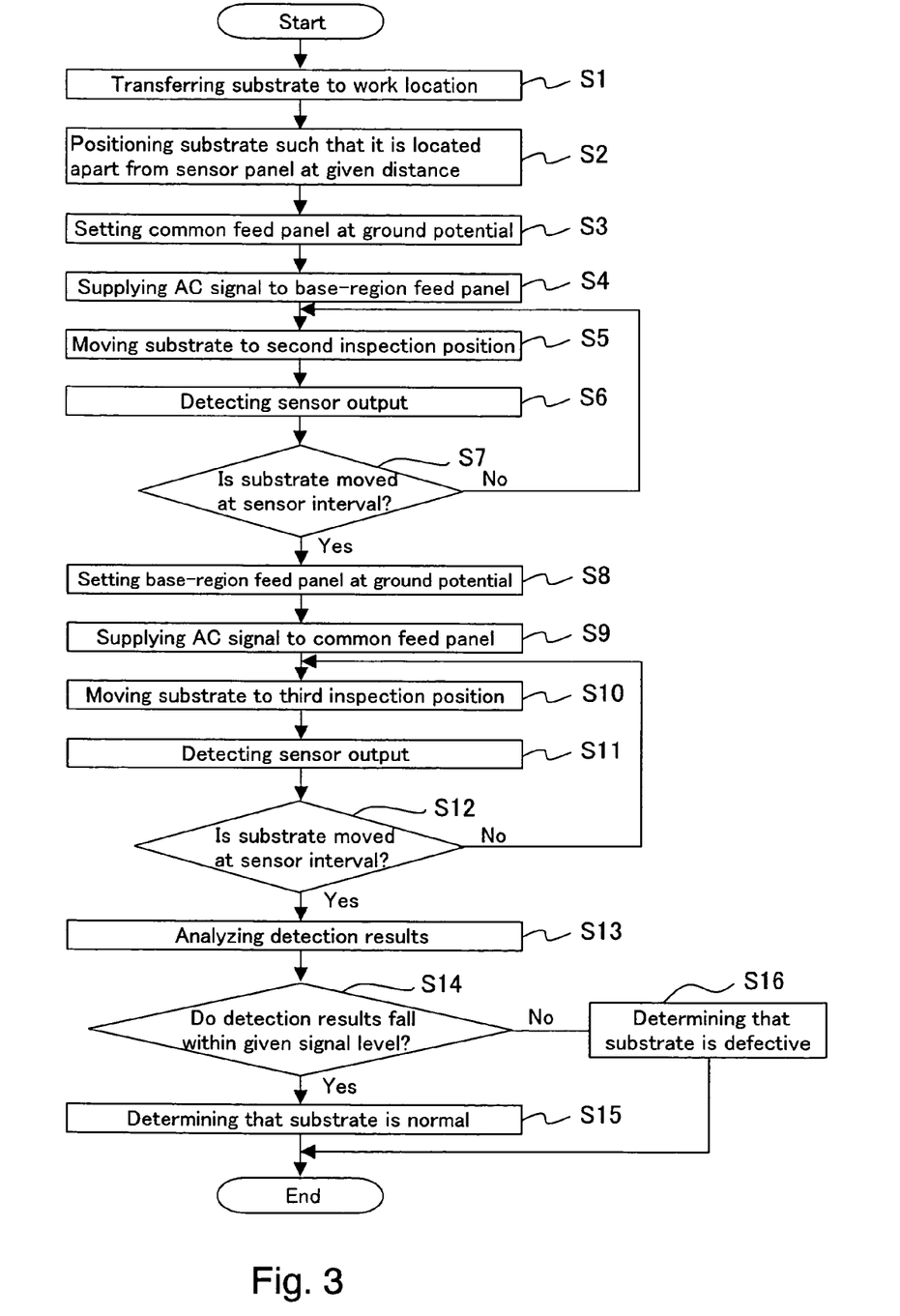
FIG. 3 is a flowchart of a control process of inspecting conductive patterns in the circuit-pattern inspection apparatus.

With reference a flowchart illustrated in to FIG. 3, a control process of inspecting conductive patterns in the above circuit-pattern inspection apparatus will be described below.

In Step S1, a board (a glass board in this embodiment) having a surface formed with the conductive patterns, or an inspection object, as shown in FIG. 1 is transferred along a transfer line (not shown) to the location of the circuit-pattern inspection apparatus (hereinafter referred to as "work location").

In Step S2, the board transferred to the work location is held by a jig or a board mounting stage (not shown). This jig has a 3-dimensional position control function capable of controlling four axes of X, Y, Z and angle. Specifically, the jig is operable to lift the board up to a position where it is brought into contact with the sensor panel provided with the base-region feed panel 110, the common feed panel 120 and the sensors 131, 132, 133, and then position the board such that it is located apart from the sensor panel at a given distance. For example, the above initial position or a positional reference relationship between the board and the panels 110, 120, 130 before an actual measurement or inspection is shown in FIG. 1.

After the board is arranged at the initial inspection position, the second AC signal generating unit 230 is first controlled to allow the common feed panel 120 to have a ground potential, in Step S3. Then, in Step S4, the first AC signal generating unit 220 is controlled to supply an AC signal to the base-region feed panel 110.

That is, in a first inspection operation, the AC signal is applied to the base-region feed panel 110 while maintaining the common feed panel 120 at a ground potential.

Then, in Step S5, the board is moved from the initial position illustrated in FIG. 1 to a second inspection position in the direction of the arrow. Simultaneously, in Step S6, the sensor-output processing circuit 210 picks up a detected signal from the sensors 131, 132, 133 on a time-series basis to allow the respective outputs of the sensors to be distinguished in the detected signal, and stores the detected signal in an internal memory (not shown) thereof.

For example, the sensor-output processing circuit 210 includes an amplifier circuit for amplifying the outputs from the sensors 131, 132, 133 at a certain signal level, a multiplexer circuit for allowing the outputs of the sensors to be time-divisionally detected, an analog-digital converter circuit for converting the analog detected signal to a digital signal, and a memory for storing the digital detection signal.

Then, in Step S7, it is checked whether the moved distance of the board is equal to the distance between the adjacent sensors (hereinafter referred to as "sensor interval"). If the moved distance of the board is not equal to the sensor interval, the process will return to Step S5 and repeat the same steps.

If, in Step S7, it is determined that the moved distance of the board is equal to the sensor interval, the process will advance to Step S8, and the first AC signal generating unit 220 will be controlled to allow the base-region feed panel 110 to have a ground potential.

Then, in Step S9, the second AC signal generating unit 230 is controlled to supply an AC signal to the common feed panel 120. That is, the respective positions of the switches of the first and second AC signal generating units 220, 230 are reversed relative to those in FIG. 1.

Then, in Step S10, the board is moved to a third inspection position, for example, in the same way as that in Step S5. Simultaneously, in Step S11, the sensor-output processing circuit 210 detects the outputs from the sensors 131, 132, 133 on a time-series basis, and stores the detected signal in the internal memory (not shown).

Then, in Step S12, it is checked whether the moved distance of the board is equal to the sensor interval, as with Step S7. If the moved distance of the board is not equal to the sensor interval, the process will return to Step S10 and repeat the same steps.

If, in Step S12, it is determined that the moved distance of the board is equal to the sensor interval, the process will advance to Step S13. In Step S13, the respective detected signals in Steps S6 and S11 are combined. The combined detected signal is converted to have a certain level, and analyzed.

Then, in Step S14, it is checked whether all of the analyzed levels of the detected signal in the respective positions of the conductive patterns fall within a given signal level. For example, if the level of the detected signal falls within the signal level as shown on the right side of FIG. 2(A), the process will advance to Step S15. In Step 15, it is determined that all of the conductive patterns in the board are normal, and the process is completed. Then, the inspected board is moved downward to a transfer position, and placed on the transfer line to transfer it to a subsequent process. If the inspection is continuously performed, the process will be started from Step S2 when a new board is transferred to the work location, and the above steps will be repeated.

If, in Step S14, the level of the detected signal does not fall within the given signal level, the process will advance to Step S16. In Step S16, it is determined that the inspected board includes a defective conductive pattern, and the process is completed. Then, the defective board is moved downward to a transfer position, and placed on the transfer line to transfer it to a subsequent stage or took out of the transfer line.

Figure 4:
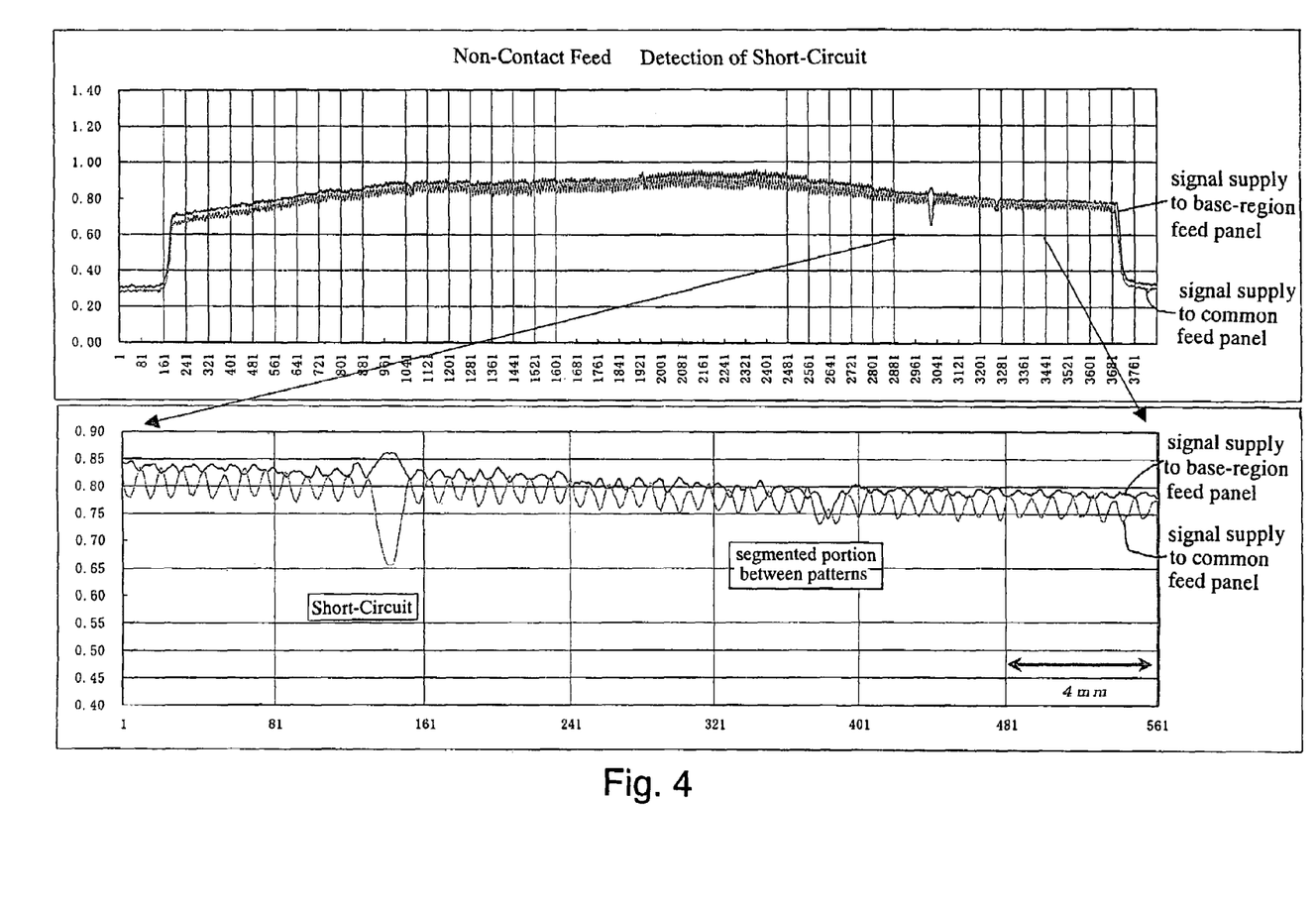
FIG. 4 is a diagram showing one example of a detection result using the circuit-pattern inspection apparatus, wherein adjacent conductive patterns are short-circuited due to a connecting portion therebetween.
Figure 5:
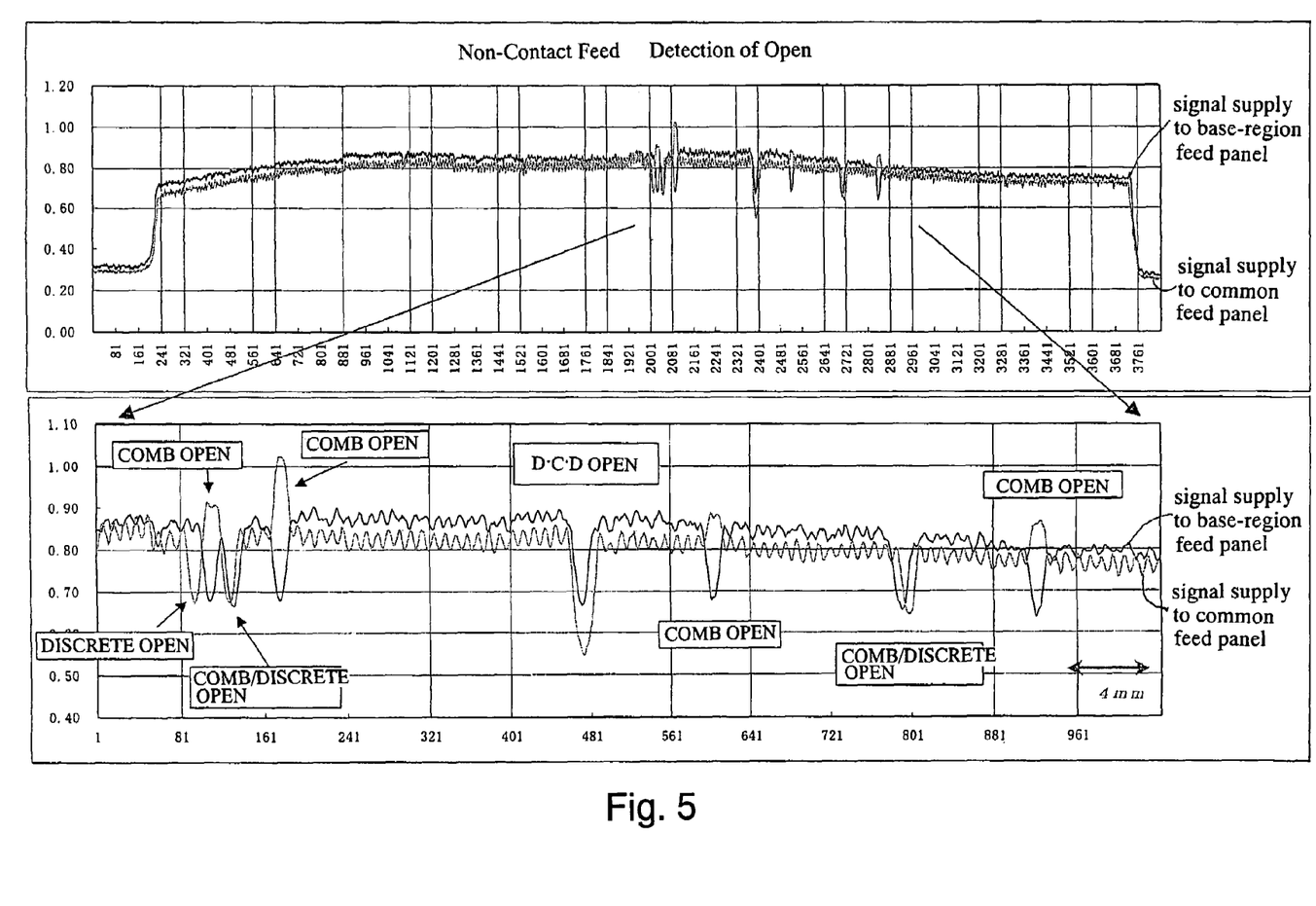
FIG. 5 is a diagram showing another example of a detection result using the circuit-pattern inspection apparatus, wherein a conductive pattern is opened due to a disconnected portion therein.

The sensor outputs appear in the form of the changes in the detected signal, as shown on the bottom side of FIG. 1. FIGS. 4 and 5 show examples of an actual detection result in the circuit-pattern inspection apparatus according to this embodiment.

FIG. 4 is a diagram showing one example of a detection result using the circuit-pattern inspection apparatus, wherein adjacent conductive patterns are short-circuited due to a connecting portion therebetween. FIG. 5 is a diagram showing another example of a detection result using the circuit-pattern inspection apparatus, wherein a conductive pattern is opened due to a disconnected portion therein.

In FIGS. 4 and 5, an entire detection result is shown on the upper side, and a fragmentary enlarged detection result is shown on the lower side.

The detection result of the conductive patterns including a short-circuited portion therebetween is shown on the lower left side of FIG. 4 as indicated by "Short-Circuit".

When an AC signal is supplied to the base-region feed panel 110, the level of the detected signal is increased because the AC signal is continuously detected from two conductive patterns, or the finger pattern segment and the discrete pattern adjacent to one another. Further, when an AC signal is supplied to the common feed panel 120, the level of the detected signal is significantly reduced because the AC signal is also transmitted toward the base-region feed panel 110.

Thus, the distinctive characteristics of the two detection results can be advantageously combined to prevent the erroneous judgment of the detection result due to noises or the like.

In FIG. 5, the detection result indicated by "COMB OPEN" means that the comb-shaped pattern 20 is partly opened due to a disconnected portion therein. The detection result indicated by "DISCRETE OPEN" means that one of the discrete patterns 30 is opened due to a disconnected portion therein. The detection result indicated by "COMB/DISCRETE OPEN" means that each of the comb-shaped pattern 20 and the discrete patterns 30 is partly opened due to a disconnected portion therein. The detection result indicated by "D•C•D" means that each of adjacent patterns consisting of the discrete patterns 30, the comb-shaped pattern 20 and another one of the discrete patterns 30 is partly opened due to a disconnected portion therein.

As shown in FIG. 5, the difference between the respective waveforms of the detected signal corresponding to the outputs of the sensors 131, 132, 133 can be effectively increased by controlling such that an AC signal is supplied alternately to either one of the base-region feed panel 110 and the common feed panel 120 while maintaining the other of the base-region feed panel 110 and the common feed panel 120 at a ground potential. This distinctive detection result makes it possible to facilitate judging the conductive patterns and the identifying the factors of defects.

In particular, when each of a plurality of adjacent patterns includes a disconnected portion, the control of supplying an AC signal to the base-region feed panel 110 and the common feed panel 120 at different timings can provide a detection result corresponding to the respective outputs of the sensors 131, 132, 133, which is significantly different from a detection result in a case where only one pattern includes a disconnected portion. Thus, the presence and factors of defects in the conductive patterns can be readily judged or identified to facilitate determining whether the defects can be recovered.

In this embodiment, the distinctive characteristic is not provided in only one of the two kinds of the detected signal waveforms in response to the base-region feed panel 110 and the common feed panel 120 but in both the detected signal waveforms. Thus, it can be readily discriminated whether a change in a detection result is caused by noises mixed in the detected signal or by defects in the conductive patterns, so as to provide enhanced reliability in the inspection of boards.

In the above embodiment, the finger pattern segments 20A of the comb-shaped pattern 20 and the discrete patterns 30 are arranged approximately in parallel with each other at even pitches, over the vicinity of the base region to the vicinity of the edge region thereof. For such an arrangement, instead of providing a plurality of feed terminals panel for supplying an inspection signal, respectively, to the finger pattern segments 20A and the discrete patterns 30, and a plurality of dedicated sensors for each of the finger pattern segments 20A and the discrete patterns 30, the above embodiment employs the base-region and common feed panels each extending in the range corresponding to the entire width of the arrangement of the finger pattern segments 20A and the discrete patterns 30, and the sensors having versatility.

Thus, any restriction from the respective pattern pitches in the base and edge regions can be eliminated. Even if the base and edge regions have different pattern pitches, the circuit-pattern inspection apparatus according to the above embodiment can be used without any modification. For example, if the conductive patterns have a pattern pitch reduced in the base region, the control of the inspection apparatus can be used without any change.

While the board in the above embodiment has only the conductive patterns as shown in FIG. 1, plural sets of the conductive patterns in FIG. 1 may be formed on a board, and separated in a subsequent process to form a plurality of products. In this case, the feed panels and the sensor panel are preferably provided to each of the conductive pattern sets. The censor-output processing circuit 10 may be commonly used for the conductive pattern sets by means of a time-division processing of the outputs from the sensors.

It is understood that the present invention may be applied not only to the conductive patterns arranged as in FIG. 1. Specifically, the present invention can be applied to a plurality of conductive pattern sets formed on a board, for example, a plural number of the conductive pattern sets arranged vertically and horizontally. Further, the present invention may be applied to a large-size panel formed with a number of conductive pattern sets in a matrix arrangement. In this connection, the detection results in FIGS. 4 and 5 were obtained from the inspection of a board formed with four conductive pattern sets.

INDUSTRIAL APPLICABILITY

As mentioned above, according to the present invention, defects in conductive patterns as an inspection object can be reliably detected.

In addition, the state or factor of the defect can be readily judged and identified by comparing two kinds of detected signal waveforms even if detection results include noises.

What is claimed is:

1. A circuit-pattern inspection apparatus for inspecting conductive patterns formed on a board, said conductive patterns including a conductive comb-shaped pattern and a plurality of conductive discrete patterns, said conductive comb-shaped pattern having an edge region formed as a plurality of finger pattern segments arranged approximately in parallel with each other and a base region formed as an integral connection pattern segment integrally connecting the base-side ends of said finger pattern segments, each of said conductive discrete patterns being disposed between the adjacent finger pattern segments to extend from the vicinity of the base region to the vicinity of the edge region of said comb-shaped pattern in a non-connecting manner, each of at least a part of said discrete patterns being not in connecting with the remaining discrete patterns, said circuit-pattern inspection apparatus comprising:

edge-region capacitive coupling means adapted to be capacitively coupled with said finger pattern segments and said discrete patterns one by one in the vicinity of the edge region of said comb-shaped pattern while ensuring a sufficient coupling capacity therebetween in a non-contact manner;

base-region capacitive coupling means extending in a given range capable of being capacitively coupled with the entire region of said connection pattern segment of said comb-shaped pattern while ensuring a sufficient coupling capacity therebetween in a non-contact manner;

common capacitive coupling means extending in a given range capable of being capacitively coupled with the respective base-side ends of said finger pattern segments branched from said connection pattern segment and the respective base-side ends of said discrete patterns located adjacent to the base region of said comb-shaped pattern, while ensuring a sufficient coupling capacity therebetween in a non-contact manner;

inspection-signal supply means for supplying an inspection signal to either one of said base-region and common capacitive coupling means; and detect means for detecting changes in a signal from the respective edge-side ends of said finger pattern segments and said discrete patterns through said edge-region capacitive coupling means in response to said inspection signal supplied from said inspection-signal supply means, wherein each of said comb-shaped pattern and said discrete patterns is inspected in accordance with a first detection result obtained through said detect means in response to the inspection signal supplied to said base-region capacitive coupling means, and a second detection result obtained through said detect means in response to the inspection signal supplied to said common capacitive coupling means.

2. The circuit-pattern inspection apparatus as defined in claim 1, wherein said board is principally made of glass, wherein each of said finger pattern segments and said discrete patterns is formed in a strip shape having a given width, and said finger pattern segments and said discrete patterns are alternately arranged on said glass board in the width direction.

3. The circuit-pattern inspection apparatus as defined in claim 2, wherein each of said edge-region, base-region and common capacitive coupling means includes a non-contact plate adapted to be controllably positioned to said conductive patterns while leaving a given distance therebetween.

4. The circuit-pattern inspection apparatus as defined in claim 3, wherein said non-contact plate of said edge-region capacitive coupling means extends in a range equal to or less than the width of each of said finger pattern segments and said discrete patterns to be capacitively coupled with said non-contact plate of said edge-region capacitive coupling means.

5. The circuit-pattern inspection apparatus as defined in claim 3 or 4, wherein the non-contact plate of said base-region capacitive coupling means has approximately the same area to be opposed to and capacitively coupled with said conductive patterns, as that of the non-contact plate of said common capacitive coupling means.

6. The circuit-pattern inspection apparatus as defined in either one of claims 1 to 4, wherein said inspection signal is an AC signal.

7. A method for inspecting conductive patterns formed on a board, said conductive patterns including a conductive comb-shaped pattern and a plurality of conductive discrete patterns, said comb-shaped pattern having an edge region formed as a plurality of finger pattern segments arranged approximately in parallel with each other and a base region formed as an integral connection pattern segment integrally connecting the base-side ends of said finger pattern segments, each of said conductive discrete patterns being disposed between the adjacent finger pattern segments to extend from the vicinity of the base region to the vicinity of the edge region of said comb-shaped pattern in a non-connecting manner, each of at least a part of said discrete patterns being not in connecting with the remaining discrete patterns, said method comprising the steps of:

supplying an AC signal to a first zone consisting of either one of base-region capacitive coupling means and common capacitive coupling means so as to provide said AC signal to a portion of said conductive patterns to be inspected while maintaining a second zone consisting of the other of said base-region and common capacitive coupling means, at a ground potential, said base-region capacitive coupling means extending in a given range capable of being capacitively coupled with the entire region of said connection pattern segment of said comb-shaped pattern while ensuring a sufficient coupling capacity therebetween in a non-contact manner, said common capacitive coupling means extending in a given range capable of being capacitively coupled with the respective base-side ends of said finger pattern segments branched from said connection pattern segment and the respective base-side ends of said discrete patterns located adjacent to the base region of said comb-shaped pattern, while ensuring a sufficient coupling capacity therebetween in a non-contact manner;

detecting said provided AC signal through edge-region capacitive coupling means adapted to be capacitively coupled with said finger pattern segments and said discrete patterns one by one in the vicinity of the edge region of said comb-shaped pattern while ensuring a sufficient coupling capacity therebetween in a non-contact manner;

after said AC signal is detected from all of said finger pattern segments and said discrete patterns, supplying an AC signal to said second zone so as to provide said AC signal to a portion of said conductive patterns to be inspected while maintaining said first zone at a ground potential;

detecting said provided AC signal through said edge-region capacitive coupling means; and determining the presence of defects in said inspected conductive patterns in accordance with a first detection result obtained in response to the AC signal supplied to said first zone, and a second detection result obtained in response to the AC signal supplied to said second zone.

8. The method as defined in claim 7, wherein each of said base-region, common and edge-region capacitive coupling means includes a non-contact plate adapted to be controllably positioned to said conductive patterns while leaving a given distance therebetween.

9. The method as defined in claim 7 or 8, wherein said non-contact plate of said base-region capacitive coupling means has approximately the same area to be opposed to and capacitively coupled with said conductive patterns, as that of said non-contact plate of said common capacitive coupling means, so as to suppress the variance in detection results due to changes in means for supplying the AC signal.

10. A recording medium recording therein a computer program for achieving the method as defined in either one of claims 7 and 8 under computer control.

* * * * *